(12) United States Patent
Götz

(10) Patent No.: US 11,165,329 B2
(45) Date of Patent: Nov. 2, 2021

(54) CONTROL CIRCUIT

(71) Applicant: Dr. Ing. h.c. F. Porsche Aktiengesellschaft, Stuttgart (DE)

(72) Inventor: Stefan Götz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 153 days.

(21) Appl. No.: 16/347,348

(22) PCT Filed: Jun. 7, 2017

(86) PCT No.: PCT/EP2017/025161
§ 371 (c)(1),
(2) Date: May 3, 2019

(87) PCT Pub. No.: WO2018/091145
PCT Pub. Date: May 24, 2018

(65) Prior Publication Data
US 2020/0266694 A1    Aug. 20, 2020

(30) Foreign Application Priority Data

Nov. 16, 2016 (DE) .......................... 102016122003.5

(51) Int. Cl.
*H02M 1/44* (2007.01)
*H02M 1/08* (2006.01)
*H03K 17/16* (2006.01)

(52) U.S. Cl.
CPC .............. *H02M 1/08* (2013.01); *H02M 1/44* (2013.01); *H03K 17/163* (2013.01)

(58) Field of Classification Search
CPC ......... H02M 1/08; H02M 1/44; H03K 17/163
See application file for complete search history.

(56) References Cited

U.S. PATENT DOCUMENTS 10,992,296 B2 * 4/2021 Sinn ..................... H03K 17/163
2006/0244498 A1  11/2006 Kohout et al.
2014/0145658 A1   5/2014 Heo et al.

FOREIGN PATENT DOCUMENTS

JP    2011166920 A    8/2011
WO   2006013025 A2   2/2000

OTHER PUBLICATIONS

International Search Report and Written Opinion for International Application No. PCT/EP2017/025161, dated Sep. 7, 2017—9 pages.

* cited by examiner

*Primary Examiner* — Patrick O Neill
(74) *Attorney, Agent, or Firm* — RatnerPrestia

(57) ABSTRACT

A control circuit for a converter for use in a vehicle, such as an electrically powered vehicle. The converter has at least one controllable power semiconductor device. The control circuit is designed to control a changeover procedure of the at least one controllable power semiconductor device based on a control signal, and the control circuit is designed to control the at least one controllable power semiconductor device based on the control signal by temporally adjusting the behaviour of the at least one controllable power semiconductor device during the changeover procedure while taking a shaping parameter into account. The shaping parameter is a shaping parameter for electromagnetic emissions of the at least one controllable power semiconductor device. Also described is a converter for use in a vehicle having the at least one control circuit of that type, a vehicle having at least one converter of that type, and a corresponding method.

11 Claims, 9 Drawing Sheets

CONTROL CIRCUIT

CROSS-REFERENCE TO RELATED APPLICATIONS

This U.S. national phase patent application claims priority to PCT International Patent Application No. PCT/EP2017/025161, filed Jun. 7, 2017, which claims priority to German Patent Application No. DE 102016122003.5, filed Nov. 16, 2016, the contents of each application being incorporated by reference herein in its entirety.

FIELD OF THE INVENTION

The present invention relates to a drive circuit for a converter for use in a vehicle, in particular in a vehicle having an electric drive, wherein the converter has at least one controllable power semiconductor, and the drive circuit is configured to drive a switching procedure of the at least one controllable power semiconductor on the basis of a control signal.

The present invention also relates to a converter for use in a vehicle, in particular in a vehicle having an electric drive, having at least one abovementioned drive circuit.

The present invention furthermore relates to a vehicle, in particular a vehicle having an electric drive, having at least one abovementioned converter.

The present invention likewise relates to a method for driving a converter for use in a vehicle, in particular in a vehicle having an electric drive, wherein the converter has at least one controllable power semiconductor, wherein the method comprises driving a switching procedure of the at least one controllable power semiconductor on the basis of a control signal.

BACKGROUND OF THE INVENTION

Converters are quiescent electrical devices for converting one fed-in electric current type, that is to say DC current or AC current, into the respective other current type, or for changing characteristic parameters of the current type, such as the voltage or the frequency. Both of said principles may also be applied in combination in a converter, that is to say one current type is converted into another current type and, at the same time, for example, a voltage between an input side and an output side of the converter is changed. There are various structural forms or types of converters for a wide spectrum of fields of application.

Converters are used for example for the open-loop control and closed-loop control of electric motors having variable rotational speed. One important case of application in this context is the use in vehicles that are configured as electric and hybrid vehicles having an electric motor.

Converters typically comprise controllable switches in order to convert currents and voltages that are present. On account of often high electric powers, controllable power semiconductors such as for example field-effect transistors, IGBTs, thyristors, bipolar transistors or other power semiconductors are used here.

Converters are used in vehicles having an electric drive, for example to convert an externally provided grid voltage into a charging voltage for an energy storage of the vehicle. The energy storage is normally a battery and normally comprises a multiplicity of individual cells that are connected together in order to form the battery.

Furthermore, the converters for converting a battery voltage of the energy storage may be converted into a motor voltage for driving the electric motor. Furthermore, in this case, power adjustment may be performed for the motor, as is explained in detail below.

The vehicle may in principle be any vehicle having an electric drive. Accordingly, the vehicle comprises at least one electric motor, for example for driving an axle of the vehicle. As an alternative, the electric drive may also have a multiplicity of electric motors that each directly drive a wheel of the vehicle, for example. Such vehicles comprise purely electrically operated vehicles, that is to say electric vehicles, and also vehicles that have an electric drive in addition to another drive, for example an internal combustion engine. The latter vehicles are commonly referred to as hybrid vehicles. In the case of plug-in hybrid vehicles, the energy storage thereof may additionally be charged with electrical energy by way of a charging socket.

Typical power electronics circuits use controllable power semiconductors almost exclusively as switches and avoid lossy resistive long-term operation. For this reason, it is only possible to generate quantized output voltages. These may be achieved for example in current-controlled circuits, typically using thyristors, as is conventional for example in railway drives.

A simple conversion for the purpose of modulating a continuous signal is illustrated in FIG. 1. In this case, controllable switches are used to switch a modulated signal between two stages, called levels here, in order to approximate the useful signal.

Intermediate stages of the output voltage are generated on average over time through rapid switching between neighboring stages. Corresponding drive operations use for example a switch modulation and are also known as switched-mode power supplies. A conversion based on this for the purpose of modulating a continuous signal is illustrated in FIG. 2. In this case, controllable switches are used to switch a modulated signal between nine stages, called levels here, in order to approximate the useful signal.

The output voltages are usually produced by pulse width modulation (PWM) having a fixed clock cycle. In principle, other types of pulse modulation are also known, for example pulse amplitude modulation (PAM), pulse frequency modulation (PFM) and pulse phase modulation (PPM), these however being less widespread. The output voltages are generated for example by sine-triangle modulation, as was widespread in early analog circuits, or using digital PWM, also called dPWM. The upper part of FIG. 3 shows a typical sine-triangle modulation. The lower part of FIG. 3 shows a digital PWM.

FIG. 4 shows a typical drive circuit 10 from the prior art for driving two field-effect transistors 12, denoted FETs 12 hereinafter. The drive circuit 10 comprises a gate driver chip 14, The gate driver chip 14 receives a control signal 18 at an input 16. The gate driver chip 14 delivers two drive signals 22 via outputs 20. There is fixed setting of the drive signals 22 by way of switch networks 24, before the drive signals 22 drive the gates G of the FETs 12. The switch networks 24 are fixed switch networks 24 that are typically constructed using resistors, in particular in the form of a "gate resistor", and less commonly also using diodes, chokes and/or capacitors, for controlling a switch-on and switch-off speed of the field-effect transistors 12.

A key disadvantage is the generation of switching harmonics in the spectrum of the output voltage. Distortions may occur that lead to deviations of the actually generated temporal profile of output values, for example of the voltage, of the current and/or of the electric power, from an ideal desired profile. The distortions may in this case range as far as into a high gigahertz region and have high power densities. As a result, the distortions, in the form of electromagnetic emissions, may interfere with other devices.

Communications systems in the vehicle in particular are susceptible to interference on account of their radio-based electromagnetic communication or wired rapid bus systems. In many communications technologies that are currently used, frequencies in the gigahertz region are normal. These communications technologies include for example GPS, Bluetooth, WLAN, GSM, UMTS, LTE or other communications technologies. Furthermore, electromagnetic emissions in many frequency bands and electromagnetic compatibility are regulated by law and require certification.

Conventional power electronics circuits, on account of their switching activity, generate very broadband interference that has to be removed, in a cumbersome manner, using EMC filters in order to comply with the predefined limits. To this end, power electronics filters are known for various fields of application, for example having a typical so-called pi structure. Corresponding filters are expensive and generate considerable energy losses, especially in power electronics circuits having high powers.

The causes of high-frequency distortions and electromagnetic emissions resulting therefrom lie in the generation of output values in relation to the switching activity of the controllable power semiconductors that are used. As a result of the modulation that is used, typically pulse width modulation, the output values are generated only on average over time.

In low frequency ranges of around a few hundred kilohertz, the switching cycle and the selection of the switching times for the PWM are primarily responsible for distortions. At high frequencies of a few hundred kilohertz to much higher than one gigahertz, which in particular interfere with the abovementioned communication technologies and also with rapid wired data transmission buses and processors, the switching cycle of the PWM has only a limited influence. In this range, the distortions are dominated by a temporal switch-on and switch-off behavior of the controllable power semiconductors.

The controllable power semiconductors require a switching time for the switching that may be in the region of a few nanoseconds or microseconds. They cannot perform the switching instantaneously. This has the effect that the current also does not flow immediately through the power semiconductor or is interrupted. The same situation arises for a rise or drop in a load voltage.

The switching procedures during switching of the controllable power semiconductors generate a characteristic spectral fingerprint, whose frequency components are higher the more rapid the switching procedure. A corresponding frequency spectrum is illustrated by way of example in FIG. 5 for an FET as controllable power semiconductor.

The reason for the respective profile of the switch-on or switch-off behavior differs depending on the power semiconductor that is used. In the case of FETs and IGBTs, three phenomena are essentially dominant. This is first of all a procedure of charging the gate capacitor, semiconductor-dependent charge carrier generation and recombination procedures, and application-dependent repercussions of load currents and voltages on the input.

The switching behavior of controllable power semiconductors is essentially determined by the gate driver. The charging procedure of the gate capacitor may be influenced thereby. The gate driver is a unit that amplifies power-free simple digital levels in order to provide enough current to switch on or switch off a controllable power semiconductor. Large controllable power semiconductors, such as for example IGBTs, may briefly require a few amperes, but also up to 100 A recharging current. Such currents are not able to be provided by digital levels as are generated for example by microcontrollers.

FIG. 6 illustrates a typical gate driver circuit 30 from the prior art. Such a gate driver circuit 30 may be used for example in the gate driver chip 14 according to FIG. 4. The gate driver circuit 30 is a simple amplifier circuit having an input transistor Q2, which is arranged between a supply voltage of +36 V and ground via resistors R1, R2. The input transistor Q2 is driven at its base by way of the control signal 18. A drive signal 22 is provided here by way of a downstream push-pull stage having two complementary transistors Q1, Q3.

In addition, such gate drivers may also implement additional functions such as galvanic separation, level shifting, dead time insertion in order to prevent overlapping switching-on of two controllable power semiconductors in series, monitoring of the controllable power semiconductors or the like.

On the basis of the abovementioned prior art, the invention is thus based on the object of specifying a drive circuit for a converter for use in a vehicle, in particular in a vehicle having an electric drive, a converter for use in a vehicle, in particular in a vehicle having an electric drive, having at least one such drive circuit, a vehicle, in particular a vehicle having an electric drive, having at least one such converter, and a method for driving a converter for use in a vehicle, in particular in a vehicle having an electric drive, which enable a reduction of distortions in a temporal profile of output values, are inexpensive to apply and have good EMC properties.

SUMMARY OF THE INVENTION

The object is achieved according to aspects of the invention by the features of the independent claims. Advantageous refinements of the invention are specified in the dependent claims.

According to aspects of the invention, a drive circuit for a converter for use in a vehicle is thus specified, in particular in a vehicle having an electric drive, wherein the converter has at least one controllable power semiconductor, the drive circuit is configured to drive a switching procedure of the at least one controllable power semiconductor on the basis of a control signal, and the drive circuit is configured to perform the driving of the at least one power semiconductor on the basis of the control signal with temporal setting of the behavior of the at least one power semiconductor during switching, taking into account the setting parameter, wherein the setting parameter is a setting parameter for electromagnetic emissions of the at least one power semiconductor.

According to aspects of the invention, a converter for use in a vehicle is also specified, in particular in a vehicle having an electric drive, having at least one abovementioned drive circuit.

According to aspects of the invention, a vehicle is also specified, in particular a vehicle having an electric drive, having at least one abovementioned converter.

According to aspects of the invention, a method for driving a converter for use in a vehicle is likewise specified, in particular in a vehicle having an electric drive, wherein the converter has at least one controllable power semiconductor, and the method comprises the following steps: driving a switching procedure of the at least one controllable power semiconductor on the basis of a control signal, and driving the at least one controllable power semiconductor on the basis of the control signal with temporal setting of the behavior of the at least one controllable power semiconductor during switching, taking into account a setting parameter, wherein the setting parameter is a setting parameter for electromagnetic emissions of the at least one power semiconductor.

The idea underlying the present invention is thus to control the temporal switching behavior of the corresponding controllable power semiconductor(s) in a targeted manner in order thereby to gain control over the spectrum of the distortions of the output values caused by the switching. To this end, a key externally controllable value of the switching behavior is used, which is in particular the temporal charging profile of the gate in the case of frequently used field-effect transistors (FETs) and insulated-gate bipolar transistors (IGBTs). The charging profile of the gate is able to be monitored or able to be detected by way of a temporal profile of the gate-source voltage (or in the case of an IGBT equivalently the gate-emitter voltage) and the gate current.

Switch-on is performed in all field-effect-based transistors (FET, IGFET, MISFET, MOSFET, IGBT, JFET) by charging a capacitor, the gate with respect to a channel that is able to be modulated. In the case of JFETs with a high current leakage rate due to the conductive connection between channel and source, or in IGBTs with respect to the or emitter. By way of the capacitor and the attractive electrostatic force connected therewith on an opposing capacitor electrode, the gate capacitor enriches charge carriers in the conduction channel of the transistor or generates them actively by raising energy levels of electrons. The switch-on behavior in the case of this component class is thus voltage-controlled, that is to say the charge carrier density in the channel depends—at least on balance over time and neglecting dynamic delay effects—primarily on the voltage at the gate. Starting from a certain voltage, the threshold voltage, the charge carrier density in the channel is high enough to generate an onset of the load current flow. Switch-off is performed in the opposite direction, but is otherwise equivalent.

In particular, the invention makes it possible not only to control the switch-on and/or switch-off behavior in a targeted manner, but also to control the behavior on the basis of measured or estimated emissions in the immediate past, wherein, by taking into account the switching behavior of the power semiconductors, higher frequency ranges are able to be covered.

In this case, either just the inverted profile of the switch-on procedure or in each case a specific dedicated profile may be used for the switch-off procedure.

The setting parameter may be either received and used by the drive circuit. As an alternative, the drive circuit may determine the setting parameter itself in order to influence electromagnetic emissions of the at least one power semiconductor. To this end, the drive circuit may have a control unit that provides the setting parameter. In the case of a plurality of power semiconductors, the setting parameter may comprise a multiplicity of individual parameters that together form the setting parameter. A plurality of power semiconductors may thus each be driven independently. In principle, however, all or groups of power semiconductors may also be driven using the same setting parameter.

In one advantageous refinement of the invention, the drive circuit is configured to perform a targeted change of the temporal setting of the behavior of the at least one power semiconductor during switching through targeted changing of the setting parameter during operation. The setting parameter itself is thus not fixedly predefined, but rather able to be set, so as to perform targeted adjustment of the electromagnetic emissions of the at least one power semiconductor. The change may be adaptive, so as to be able to perform an adjustment during operation. There is thus not just a temporally controllable recharging procedure of the control input of the power semiconductor, for example of the gate. If the recharging procedure were to be the same at each switching operation, that is to say switch-on or switch-off, an identical temporal profile of the switching would likewise result. This would result in identical high-frequency distortions and thus continuous emissions in the same frequency ranges. Nevertheless, it is not strictly necessary for the setting parameter always to be changed between switching procedures.

A generally white power density, that is to say a power density that is identical over a wide frequency range, of frequency components that allows switch-on or switch-off always with the same temporal dynamics, would also technically hardly be possible. This would also lead to a situation whereby, for example in the case of particularly important frequency ranges, at least one interference level would be present on account of noise. It would therefore not be possible to keep particular frequency ranges free from distortions and emissions. Important frequency ranges could be for example frequency ranges that are used by communications systems or for which the communications systems are sensitive. White emission would not be desirable here.

Through adaptive adjustment of the temporal profile of the charging and/or discharging procedure, by contrast, the average power density is able to be subjected to open-loop control or closed-loop control in a targeted manner by way of the frequency. As a result of this, an interference power is able to be distributed evenly, as a result of which power peaks in narrow frequency bands are able to be avoided.

Open-loop control or closed-loop control of the change of the setting parameter may be performed either on the basis of measurements or of estimations of the electromagnetic distortion or emission. By way of the open-loop control or closed-loop control, the temporal switching profile of the at least one controllable power semiconductor be continuously influenced by controlling the temporal recharging profile of the control input. Measurement values may in this case be the temporal blocking voltage across the corresponding controllable power semiconductor, the temporal load current, the magnetic field, for example located in the vicinity of the controllable power semiconductor or of the power circuit via a detection coil, possibly in a lower or rear-side position of a circuit board, or the electric field, for example via a detection dipole in the vicinity of the controllable power semiconductor or of the power circuit, possibly in a lower or rear-side position of a circuit board, or the like.

As the entire system consisting of gate driver and the at least one controllable power semiconductor is also easily able to be modeled, however, instead of a measurement, which is usually expensive, an estimation is generally also possible that therefore calculates a changed temporal profile of the recharging procedure on the basis of the estimation and adjusts the setting parameter accordingly.

In one advantageous refinement of the invention, the drive circuit is a digital driver circuit for the at least one controllable power semiconductor and has a setting circuit that is arranged between the digital driver circuit and the at least one controllable power semiconductor, the digital driver circuit is configured to receive a logic signal as control signal and, on the basis of the control signal, to generate a drive signal for the at least one controllable power semiconductor, the setting circuit is configured to receive the setting parameter, and the setting circuit is furthermore configured to adjust the drive signal of the digital driver circuit in order to perform the temporal setting of the behavior of the at least one controllable power semiconductor during switching, taking into account the setting parameter. Conventional driver circuits, also called gate drivers, allow a fixed charging procedure for the control input. In this case, the control input is usually charged at maximum possible speed by a binary so-called totem pole or push-pull output stage. The output is conductively connected, in each case via a transistor, either so as to switch on the power semiconductor with the positive supply voltage of the gate driver or to switch it off with the negative supply voltage of the gate driver.

The task of the driver circuit is to deliver a high-current switching signal, which, in contrast to digital levels, delivers up to double-digit ampere values and lies relative to the source terminal (in the case of an FET) or emitter terminal (in the case of an IGBT). Such driver circuits are standard in industry and therefore optimized and are obtainable at very low cost. In order also to allow adaptive forming of the temporal switch-on or switch-off procedure using this conventional driver circuit, the setting circuit is used, which performs the temporal setting of the behavior of the at least one controllable power semiconductor during switching, taking into account the setting parameter. As a result, the temporal profile of the switching is influenced.

In one advantageous refinement of the invention, the setting circuit comprises a settable resistor that is able to be set by way of the setting parameter. The settable resistor is a very simple example of an embodiment of the setting circuit. The current delivered by the driver circuit is able to be limited by the settable resistor so as to delay switching of the power semiconductor by the resistor setting the speed of the charging of the gate capacitor and linearly scaling it in a first approximation. In the case of a corresponding change of the setting parameter, however, the temporal profile of the charging of the gate capacitor is also able to be fully influenced.

In one advantageous refinement of the invention, the setting circuit comprises a resistor and a first transistor that are connected in a parallel circuit, the first transistor being able to be driven by way of the setting parameter. As a result, a switch-on procedure of the controllable power semiconductor is able to be influenced. The first transistor is preferably used as a linear closed-loop controller. The first transistor may be modulated between the limits in the off state and with maximum conductivity either continuously or in a certain number of stages. The first transistor may be an FET or a bipolar transistor, for example a pnp or npn transistor. The resistor in this case constitutes a well-defined conduction path both for the switch-on procedure in the case of a switched-off transistor and for the switch-off procedure, wherein, in the case of the switch-off procedure, the control current of the gate of the power semiconductor has to flow in the reverse direction and preferably flows through the body diode of the first transistor. Furthermore, the resistor may reduce power losses in the first transistor. For the practical design, the resistor should be dimensioned to be large enough at least to allow the lowest required switching speed of the power semiconductor.

On account of the high gate current, it may be advantageous, in particular in the case of large power circuits, to reduce the Joule heating in the first transistor by adding a further resistor. This further resistor is connected in series with the first transistor. If a transistor with a body diode is used as first transistor, that is to say with a freewheeling diode connected in antiparallel, the further resistor likewise defines the speed of the switch-off procedure. The further resistor is preferably dimensioned such that the maximum size of the parallel circuit of the resistor with the further resistor is such that the fastest required switching speed is made possible.

In one advantageous refinement of the invention, the setting circuit comprises a second transistor that is connected in parallel with or in series with the first transistor, the first and the second transistor being able to be driven independently by way of the setting parameter. In the case of a series connection, the first and the second transistor are preferably connected in opposing directions, that is to say in a push-pull manner. By using two transistors, the driving of the at least one power semiconductor on the basis of the control signal, the switch-off behavior as well as the switch-on behavior are also able to be influenced. Preferably, in addition to the two transistors, resistors are arranged in series therewith in order to set the electrical potential of the mating contacts to a value that is as well-defined as possible. This is worth recommending as, in the case of both bipolar transistors and field-effect transistors, driving has to take place relative to a mating contact. Accordingly, the driving takes place in field-effect transistors with respect to the source, and in bipolar transistors with respect to the emitter. In one embodiment, the two transistors are connected in series with an interposed resistor and arranged such that the source contact of the first transistor coincides with the gate potential of the power semiconductor. Therefore, the required voltage at the gate terminal of the first transistor is greater than the gate voltage at the power semiconductor. Therefore, the first transistor is able to be controlled fully with the supply voltages of the driver circuit, that is to say the negative supply Vss(GateDriver) thereof and the positive supply Vcc(GateDriver) thereof. Voltages that go beyond this are not necessary. For the continuous control of the first transistor, intermediate levels may accordingly be generated from said supply voltages. The same applies for the second transistor.

In another embodiment, the first and the second transistor are connected directly in series, a resistor additionally being connected in series with the two transistors. The two transistors are likewise arranged with a common source terminal (in the case of an FET) or emitter terminal (in the case of bipolar transistors). The first and the second transistor here are not used exclusively with just two stages, that is to say with maximum conductivity or fully in the off state, but rather as linear closed-loop controllers. As a result of this, the resistor of the transistors is operated with maximum conductivity or fully in the off state in a targeted manner in intermediate regions.

In one exemplary embodiment, in which the first and the second transistor are each connected in series with a resistor, and these series circuits are arranged in parallel, the function is essentially as described above. The first transistor is arranged with its resistor such that the source contact of the first transistor, which constitutes the abovementioned counter-electrode, is coincident with the gate potential of the power semiconductor. Therefore, the required voltage at the gate terminal of the first transistor is greater than the gate voltage at the power semiconductor. Therefore, the first transistor is able to be controlled fully with the supply voltages of the driver circuit, that is to say the negative supply Vss(GateDriver) thereof and the positive supply Vcc(GateDriver) thereof. Voltages that go beyond this are not necessary. For the continuous control of the first transistor, intermediate levels may accordingly be generated from said supply voltages. The same applies for the second transistor and the resistor connected in series therewith.

In one advantageous refinement of the invention, the drive circuit is configured to set the setting circuit between two switching procedures of the at least one controllable power semiconductor. The setting circuit is thus constant during the switching, that is to say during switch-on or during switch-off. Changes to the setting circuit are made from switching procedure to switching procedure. As a key control type of the setting circuit, before a gate signal of the at least one controllable power semiconductor, an associated temporarily constant resistance may be assumed.

This temporarily constant resistance may be identical for the switch-on and the switch-off procedure or else in each case different. A change of the setting circuit by way of the setting parameter is made only between switching procedures. As a result of this, the emission spectrum of the at least one power semiconductor may be controlled on average over time.

Due to the high switching rate of typical power electronics circuits of several kilohertz, the emission spectrum may effectively be modulated in the event of regular changes of the gate network. The resulting emission spectrum in this case corresponds approximately to the average of the individual spectra.

In one advantageous refinement of the invention, the drive circuit is configured to set the setting circuit during a switching procedure of the at least one controllable power semiconductor. In contrast to the setting of the setting circuit between two switching procedures, in which the overall spectrum is formed only from the average of the individual spectra, in this case the spectrum may be set exactly, as the switching procedure is able to be controlled at any time in terms of its speed. The setting circuit is preferably synchronized with the switching procedure. This may be performed for example by way of the digital signal, which also controls the driver circuit itself and transmits a status to be adopted.

In one advantageous refinement of the invention, the drive circuit has an integral driver circuit for the at least one controllable power semiconductor and is configured to receive a logic signal as control signal and, on the basis of the control signal, to generate a drive signal for the at least one controllable power semiconductor, the integral driver circuit furthermore being configured to receive the setting parameter and to perform the temporal setting of the behavior of the at least one controllable power semiconductor during switching, taking into account the setting parameter. A driver circuit is provided that integrally performs the driving of the at least one power semiconductor on the basis of the control signal with temporal setting of the behavior of the at least one power semiconductor during switching, taking into account the setting parameter. The driver circuit is preferably activated via a simple logic signal, as a result of which desired quick reaction times of a few 1-10 nanoseconds are made possible. The setting parameter is in this case provided via a separate input. The setting parameter in this case does not have to be provided at the same time as the control signal. The driver circuit, in the case of a rising or falling edge, may accordingly use the respectively associated last setting parameter. This may be technically implemented in a variety of ways, for example using a register, a sample and hold module or another memory.

In one advantageous refinement of the invention, the integral driver circuit is an analog driver circuit, the integral driver circuit has a control unit having a memory, a digital-to-analog converter and an analog amplifier stage, the control unit is configured to receive the control signal and the setting parameter and to provide a digital profile, selected by the setting parameter, of the control signal, the digital-to-analog converter is configured to convert the digital profile of the control signal into an analog driver signal, and the analog amplifier stage is configured to amplify the analog driver signal and provide it as an adjusted drive signal for the at least one controllable power semiconductor. In contrast to a conventional digital driver circuit, an analog driver circuit does not have to have an approximately square-wave voltage jump with low source impedance and therefore deliver high current capability that is configured to be approximately identical to the control signal. Instead of this, with a rising or falling control signal, a changeable temporal profile with respect to voltage and/or current is intended to be output. To this end, the driver circuit comprises a simple transistor push-pull stage, also called AB end stage, as is known from power amplifiers. Push-pull stages, which, similarly to binary driver circuits from the prior art, use at least two transistors at the power output, have the advantage that the output is able to adopt both active-high and active-low as a state. As a result of this, the output is able to output or receive both high positive and negative currents. The push-pull stage is configured either with complementary transistors, for example series-connected p-channel and n-channel FETs, or npn and pnp transistors.

In the case of the analog driver circuit, a digital signal is provided from the memory, taking into account the setting parameter. During switching of the control signal from low to high or from high to low, a profile predefined for the respective case is output from the memory serially as a binary data flow of 0 and 1, which is then converted into the analog driver signal in the digital-to-analog converter. The digital-to-analog converter is preferably formed by a low-pass filter, which smooths the 0/1 flow in order to form a smooth profile. When using a low-pass filter in the digital-to-analog conversion process, the capacitance may be kept very low on account of the high dynamics. This signal is amplified by the analog amplifier stage and provided as drive signal.

In one advantageous refinement of the invention, the drive circuit has an input for a continuous signal and is configured to receive a combined signal with the control signal and the setting parameter and, on the basis of the control signal, to generate an adjusted drive signal for the at least one controllable power semiconductor, and the drive circuit comprises an integral setting circuit that is configured to set its adjusted drive signal for the at least one controllable power semiconductor on the basis of the setting parameter in order to perform the temporal setting of the behavior of the at least one controllable power semiconductor during switching, taking into account the setting parameter.

As an alternative, the temporal profile of the output current or of the output voltage is provided directly by way of the input signal.

In one advantageous refinement of the invention, the continuous signal is a coded analog signal or a serial or parallel digital signal. By way of example, an analog signal at the input may directly code the current profile or voltage profile of the output. As an alternative, a digital input may also be used that codes the profile of the output either in series or in parallel. On account of the high required reaction speeds, a parallel input is preferred.

In one advantageous refinement of the invention, the drive circuit has a control unit that is configured to perform the driving of the at least one controllable power semiconductor with the setting parameter with closed-loop control in the manner of a terminated series. This constitutes a suitable possibility for targeted control of the emission spectrum of the at least one power semiconductor during operation beyond the MHz range.

To this end, the emission spectrum of the at least one power semiconductor is primarily controlled via only a low number of degrees of freedom. By way of example, this may be just one degree of freedom, for example the duration of the switching. The duration is given for example by the effective resistance of the setting circuit or by an amplification of the charging current constantly over the entire switch-on or switch-off duration of the at least one power semiconductor. In the case of two degrees of freedom, the first derivative of the duration of the switching may additionally be taken into account, for example. The first derivative of the duration of the switching is given for example by a number defining the current in the middle of the switching procedure in comparison with the start and end of the switching procedure.

The charging voltage of the gate of the at least one power semiconductor resembles a cumulative distribution function (CFD) and is therefore able to be described for example in this form with the same parameters. These would be for example the width (standard deviation in the case of CFD), first-order symmetry (skew in the case of CFD), curvature (kurtosis in the case of CFD), etc. As an alternative, it is possible to use typical very general parametric functions, known from statistics, to constitute CFDs, for example the gamma function. This type of description breaks the form of the switching down into a few characteristic values in the manner of a series and allows the use of conventional control methods, such as for example PID control.

Preferably, a plurality of PID control loops may control individual parameters of the series presentation of the switching procedure. Values derived from the emission spectrum, for example the maximum magnetic or electric field amplitude in a particular spectral region, may serve as control values.

To avoid closed-loop control with a closed control path and measuring of the emission spectrum, open-loop control may alternatively replace the closed-loop control.

In one advantageous refinement of the invention, the drive circuit has a control unit that is configured to perform the driving of the at least one controllable power semiconductor with the setting parameter on the basis of a determination of a connection between the temporal behavior of the at least one controllable power semiconductor during switching and a target spectrum for electromagnetic emissions using machine learning. A desired emission target spectrum may be produced by determining the connection between gate driving and target spectrum by way of machine learning. Depending on the power semiconductor that is used, the connection between the recharging dynamics at its control input (for example of the gate in the case of FETs and IGBTs) and the emission spectrum is not obvious and is influenced by nonlinearities. Machine learning methods have been developed in order to emulate and detect such complicated relationships. On this basis, it is likewise possible to create a closed-loop control system that allows closed-loop control of the emission spectrum within the meaning of the invention.

To avoid closed-loop control, as an alternative, a simple open-loop controller may be used. One possibility for an open-loop controller is statistical assignment of the parameters of the switching procedure. As described above, the switching dynamics may be described as a sigmoid function with a certain number of parameters depending on the desired flexibility, for example the moments that are also used in statistics for CFDs, or as parameters of conventional functions, for example of the gamma distribution. In a simple case, each parameter is assigned a value range and/or a statistical distribution. The control procedure consists in generating new sets of parameters more or less randomly according to these specifications following one or more switching procedures of the driver circuit. For a uniform spectrum, for example, each parameter may be varied uniformly in one range. In one preferred refinement, not only is each parameter assigned a value range and/or a statistical distribution, but a common multidimensional distribution function is predefined, which thus also defines probabilities of the occurrence of each combination of parameter values.

BRIEF DESCRIPTION OF THE DRAWING

The invention is explained in more detail below with reference to the appended drawing on the basis of preferred embodiments.

In the Figures.

DETAILED DESCRIPTION OF THE INVENTION

Figure 1:
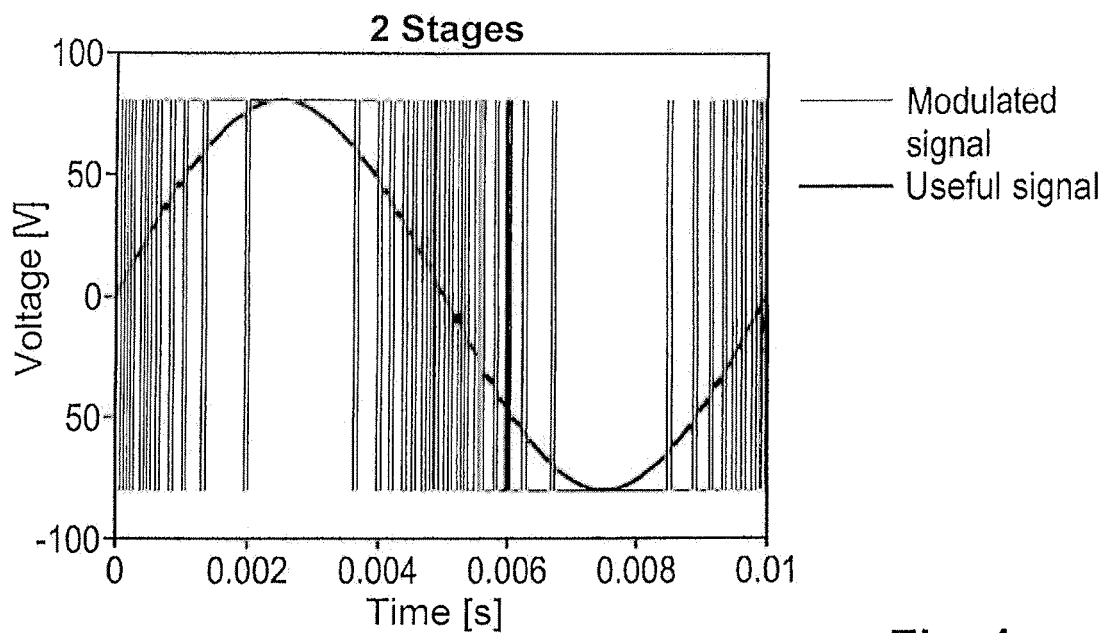
FIG. 1 shows a diagram for illustrating a simple conversion for the purpose of modulating a continuous signal by switching between two stages according to the prior art.
Figure 2:
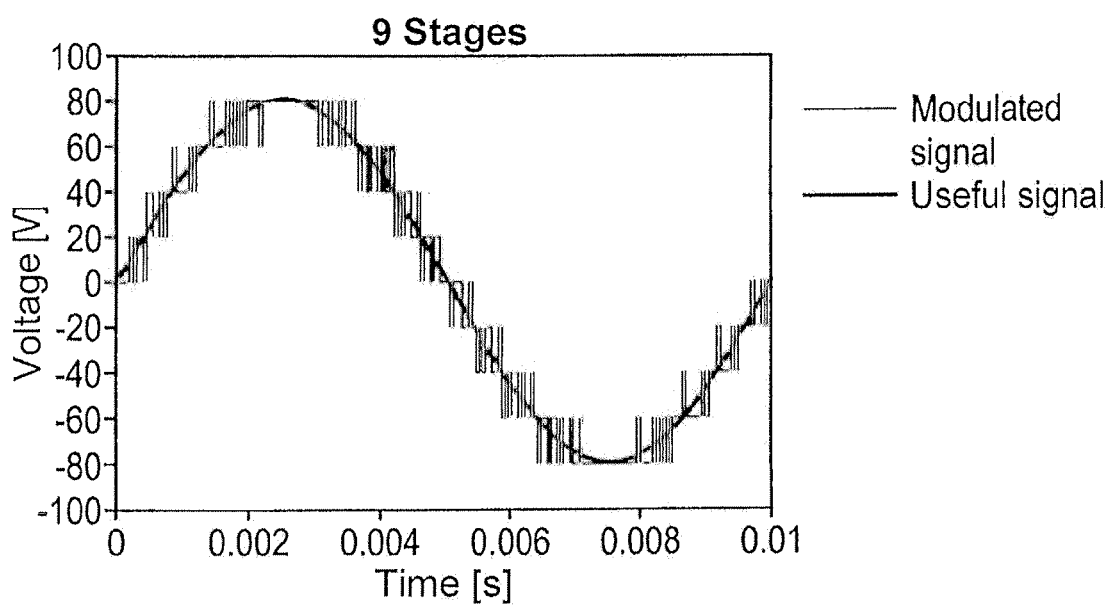
FIG. 2 shows a diagram for illustrating a simple conversion for the purpose of modulating a continuous signal by switching between nine stages according to the prior art.
Figure 3:
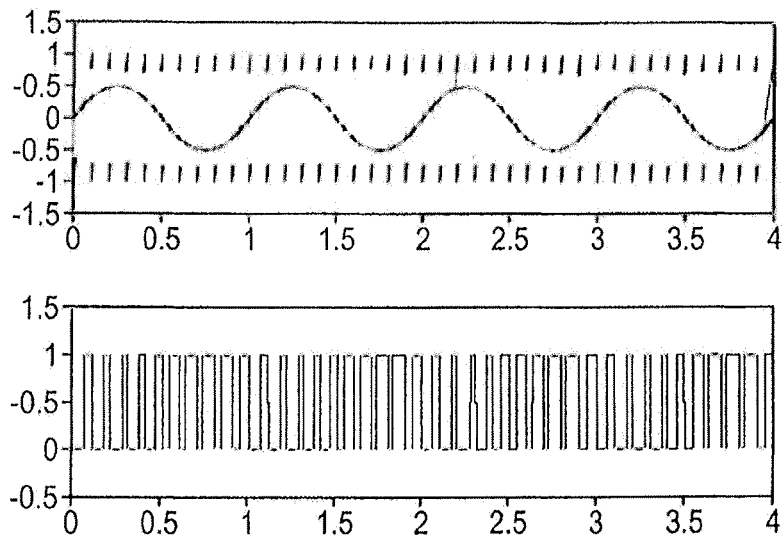
FIG. 3 shows a diagram for illustrating an analog sine-triangle modulation and a digital PWM according to the prior art.
Figure 4:
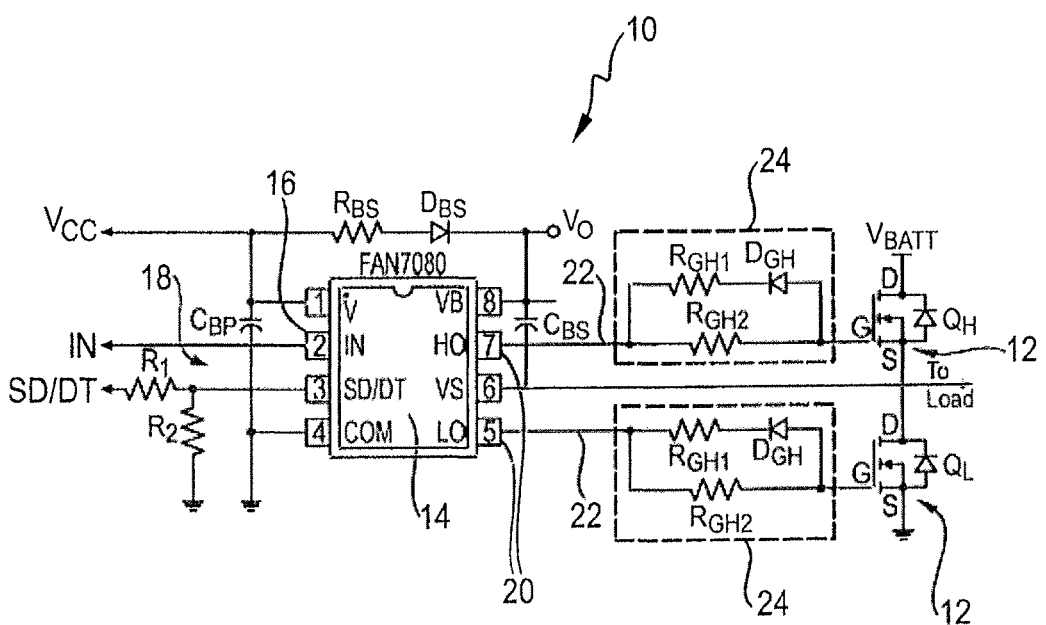
FIG. 4 shows a circuit diagram of a drive circuit from the prior art for driving two field-effect transistors having a gate driver chip and two switch networks.
Figure 5:
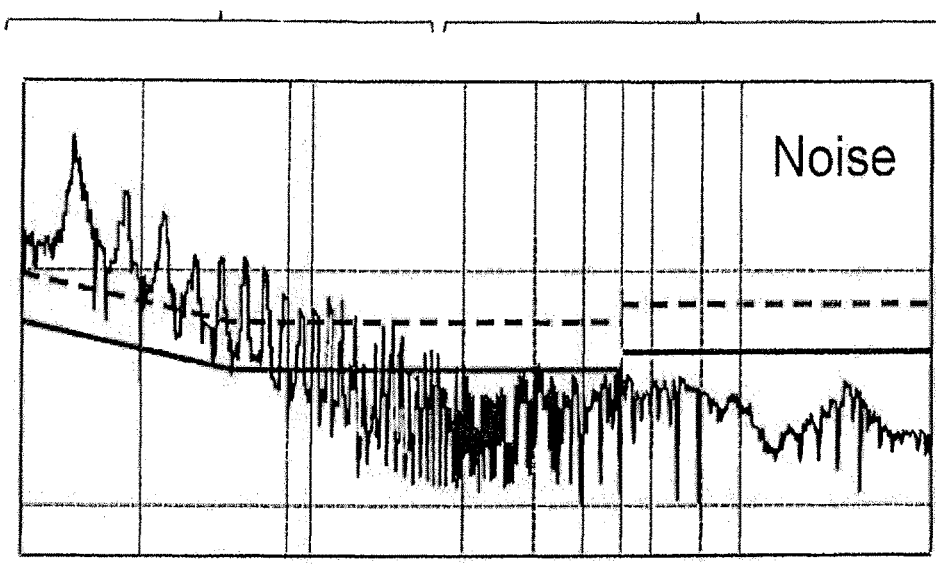
FIG. 5 shows a diagram of a resulting frequency spectrum in the case of driving using the gate driver chip from FIG. 4 according to the prior art.
Figure 6:
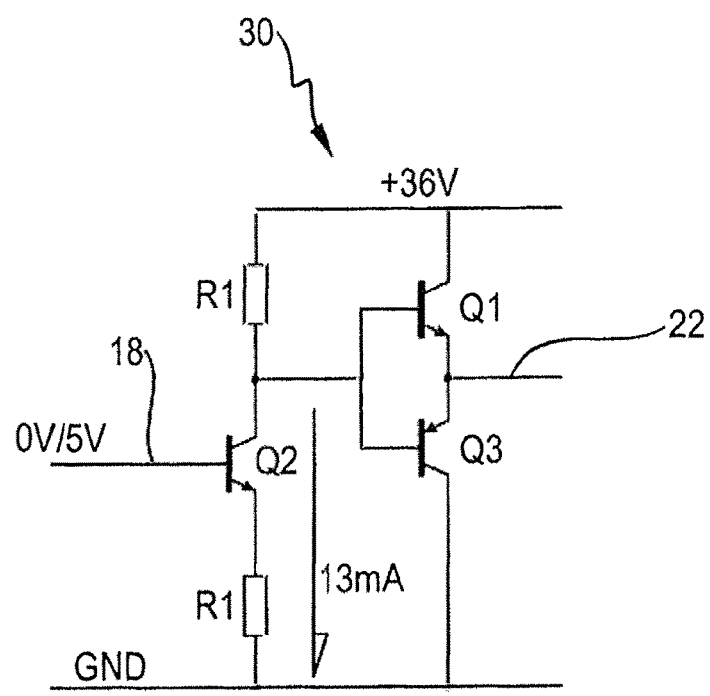
FIG. 6 shows a circuit diagram of a typical gate driver circuit from the prior art as part of the gate driver chip 14 from FIG. 4.
Figure 7:
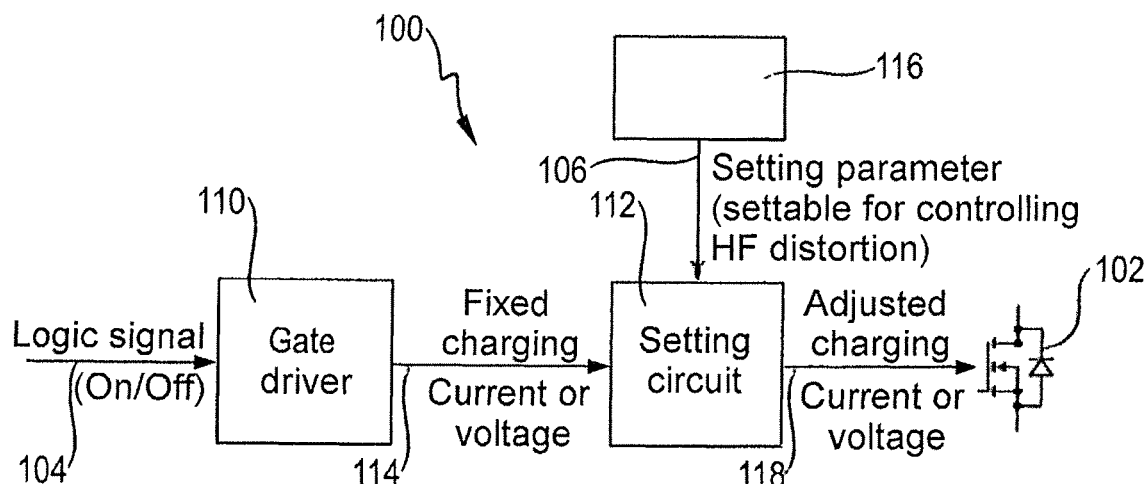
FIG. 7 shows a circuit diagram of a drive circuit having a driver circuit, a setting circuit and a control unit for driving a controllable power semiconductor according to a first embodiment.

FIG. 7 shows a drive circuit 100 according to aspects of the invention for a converter for use in a vehicle according to a first preferred embodiment of the invention.

Only one controllable power semiconductor 102 of the converter is illustrated in detail in FIG. 7. The controllable power semiconductor 102 of the first exemplary embodiment is a field-effect transistor (FET).

The drive circuit 100 is configured to drive a switching procedure of the controllable power semiconductor 102 on the basis of a control signal 104. The drive circuit 100 is furthermore configured to perform the driving of the controllable power semiconductor 102 on the basis of the control signal 104 with temporal setting of the behavior of the at least one controllable power semiconductor 102 during switching, taking into account a setting parameter 106, the setting parameter 106 being a setting parameter 106 for electromagnetic emissions of the controllable power semiconductor 102. This is achieved by temporal setting of the behavior of the controllable power semiconductor 102 during switching, taking into account the setting parameter 106.

The drive circuit 100 comprises a conventional digital driver circuit 110 and a setting circuit 112, which is arranged between the digital driver circuit 110 and the controllable power semiconductor 102. The driver circuit 110 receives the control signal 104 for driving the controllable power semiconductor 102 and generates a drive signal 114 for the controllable power semiconductor 102, which signal is fed to the setting circuit 112.

The drive circuit 100 furthermore comprises a control unit 116 that determines the setting parameter 106. Details are given below. The setting parameter 106 is transmitted to the setting circuit 112 by the control unit 116. The setting circuit 112 is configured to receive the setting parameter 106 and to adjust the drive signal 114 of the digital driver circuit 110 so as to perform the temporal setting of the behavior of the controllable power semiconductor 102 during switching, taking into account the setting parameter 106. Accordingly, an adjusted drive signal 118 is transferred from the setting circuit 112 to the gate G of the controllable power semiconductor.

Various refinements of the setting circuit 112 are described below with reference to FIGS. 8 to 14 and the corresponding exemplary embodiments 2 to 8. These embodiments are derived from the first embodiment. The embodiments in relation to this accordingly also apply for the drive circuits 100 in FIGS. 8 to 14. Details that deviate in relation to the respective setting circuit 112 are described explicitly.

Figure 8:
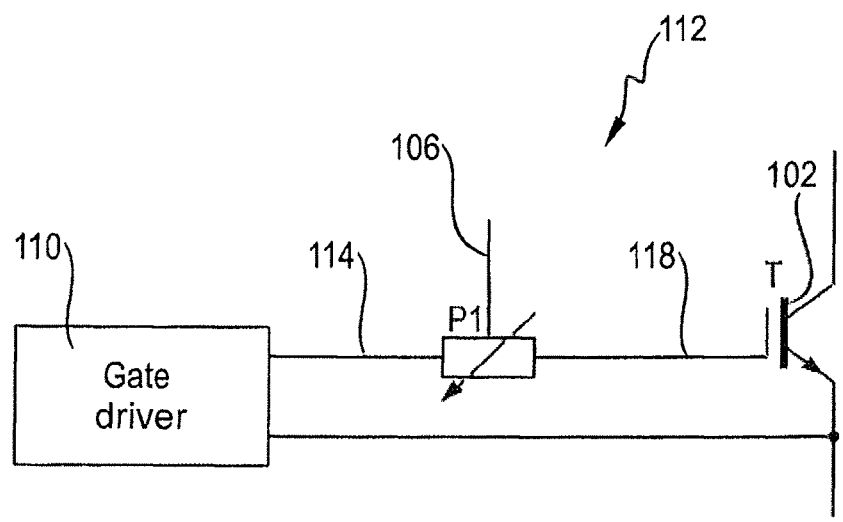
FIG. 8 shows a circuit diagram of a drive circuit having a driver circuit, a setting circuit and a control unit for driving a controllable power semiconductor according to a second embodiment, the setting circuit comprising a settable resistor.

A drive circuit 100 according to a second embodiment is illustrated in FIG. 8. The drive circuit 100 comprises, as described previously with reference to the first embodiment, a driver circuit 110, a setting circuit 112 and a control unit 116 for driving a controllable power semiconductor 102. According to the second embodiment, the setting circuit 112 comprises a settable resistor P1, and the setting parameter 106 is able to be set by the control unit 116. The settable resistor P1 limits the current delivered by the driver circuit 110 in order to delay switching of the power semiconductor 102, by the settable resistor P1 setting the speed of the charging of the gate capacitor of the controllable power semiconductor 102 and linearly scaling it in a first approximation.

Figure 9:
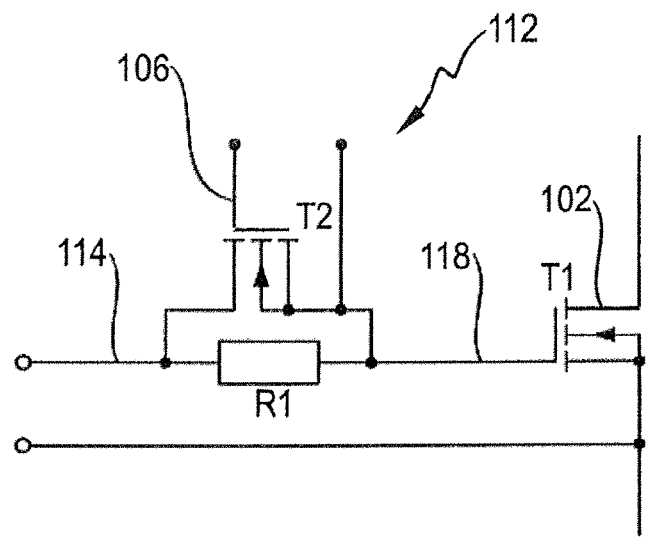
FIG. 9 shows a circuit diagram of a drive circuit having a driver circuit, a setting circuit and a control unit for driving a controllable power semiconductor according to a third embodiment, the setting circuit comprising a resistor and a first transistor, and the controllable power semiconductor being configured as an FET.

A drive circuit 100 according to a third embodiment is illustrated in FIG. 9. The drive circuit 100 comprises, as described previously with reference to the first embodiment, a driver circuit 110, a setting circuit 112 and a control unit 116 for driving a controllable power semiconductor 102, which is configured here as a field-effect transistor. According to the third embodiment, the setting circuit 112 comprises a resistor R1 and a first transistor T2 that are connected in a parallel circuit. The first transistor T2 is able to be driven by way of the setting parameter 106. The first transistor T2 may be an FET or a bipolar transistor, for example a pnp or npn transistor. The first transistor T2 is preferably used as a linear closed-loop controller and may be modulated between the limits "in the off state" and "with maximum conductivity" either continuously or in a certain number of stages.

The resistor R1 in this case constitutes a well-defined conduction path both for the switch-on procedure in the case of a switched-off transistor T2 and for the switch-off procedure, wherein, in the case of the switch-off procedure, the control current of the gate of the controllable power semiconductor 102 has to flow in the reverse direction and preferably flows through the body diode of the first transistor T2. Furthermore, the resistor R1 reduces power losses in the first transistor T2. The resistor R1 is dimensioned at least to be large enough to allow the smallest required switching speed of the controllable power semiconductor 102.

Figure 10:
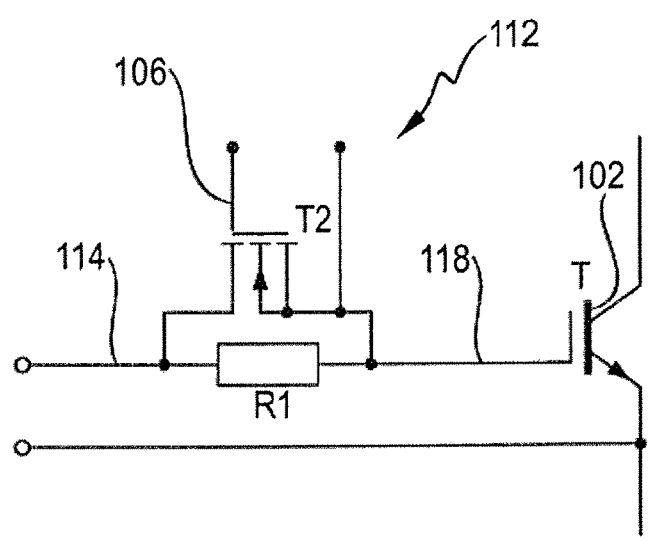
FIG. 10 shows a circuit diagram of a drive circuit having a driver circuit, a setting circuit and a control unit for driving a controllable power semiconductor according to a fourth embodiment, the setting circuit comprising a resistor and a first transistor, and the controllable power semiconductor being configured as a bipolar transistor.

A drive circuit 100 according to a fourth embodiment is illustrated in FIG. 10. The drive circuit 100 of the fourth embodiment is in principle identical to the drive circuit 100 of the third embodiment. A difference with the fourth embodiment with respect to the third embodiment consists merely in that the controllable power semiconductor 102 is a bipolar transistor, specifically an IGBT.

Figure 11:
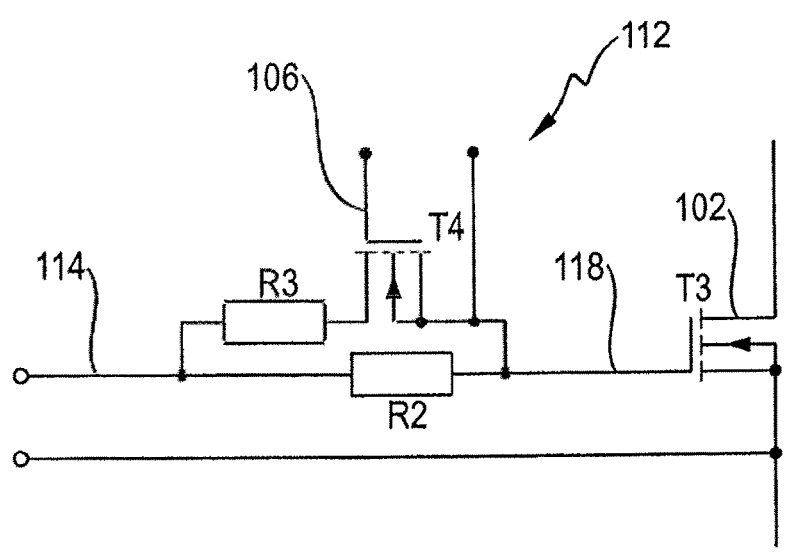
FIG. 11 shows a circuit diagram of a drive circuit having a driver circuit, a setting circuit and a control unit for driving a controllable power semiconductor according to a fifth embodiment, the setting circuit comprising a series resistor and a first transistor, and a resistor connected in parallel therewith.

A drive circuit 100 according to a fifth embodiment is illustrated in FIG. 11. The drive circuit 100 comprises, as described previously with reference to the first embodiment, a driver circuit 110, a setting circuit 112 and a control unit 116 for driving a controllable power semiconductor 102, which is configured here as a field-effect transistor.

According to the fifth embodiment, the setting circuit 112 comprises a series resistor R3 and a first transistor T2 that are connected in series. A resistor R2 is connected in parallel with this series circuit. As described previously with reference to the third embodiment of FIG. 9, the first transistor T4 is able to be driven by way of the setting parameter 106. The first transistor T4 is an FET here, by way of example.

The resistor R2, as described previously, constitutes a well-defined conduction path both for the switch-on procedure in the case of a switched-off transistor T4 and for the switch-off procedure, wherein, in the case of the switch-off procedure, the control current of the gate of the controllable power semiconductor 102 has to flow in the reverse direction and preferably flows through the body diode of the first transistor T4. Furthermore, the resistor R2 reduces power losses in the first transistor T4. The resistor R2 is dimensioned at least to be large enough to allow the smallest required switching speed of the controllable power semiconductor 102.

The series resistor R3 in this case serves to reduce Joule heating in the first transistor T4 that occurs on account of the high gate current. If a transistor with a body diode is used as first transistor T4, that is to say with a freewheeling diode connected in antiparallel, the series resistor additionally defines the speed of the switch-off procedure. The series resistor R3 is dimensioned such that the maximum size of the parallel circuit of the series resistor R3 with the resistor R2 is such that the fastest required switching speed is made possible.

Figure 12:
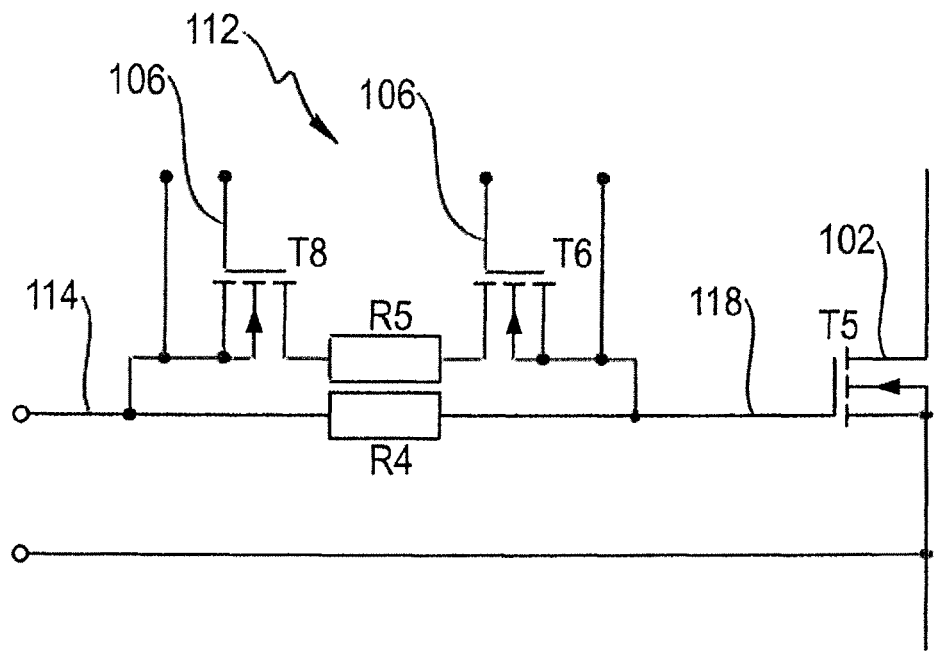
FIG. 12 shows a circuit diagram of a drive circuit having a driver circuit, a setting circuit and a control unit for driving a controllable power semiconductor according to a sixth embodiment, the setting circuit comprising a series circuit consisting of a first transistor, a series resistor and a second transistor, and a resistor connected in parallel therewith.

A drive circuit 100 according to a sixth embodiment is illustrated in FIG. 12. The drive circuit 100 comprises, as described previously with reference to the first embodiment, a driver circuit 110, a setting circuit 112 and a control unit 116 for driving a controllable power semiconductor 102, which is configured here as a field-effect transistor. According to the sixth embodiment, the setting circuit 112 comprises a first transistor T6, a series resistor R5 and a second transistor T8, which are connected in series in this order. A resistor R4 is connected in parallel with this series circuit. The first transistor T6 and the second transistor T8 are able to be driven independently by way of the setting parameter 106. The first and the second transistor T6, T8 are configured here as FETs, by way of example. The first and the second transistor T6, T8 are connected in opposing directions. One of the two transistors T6, T8 takes over the driving of the controllable power semiconductor 102 on the basis of the control signal 104 during switch-on, and the other one during switch-off.

Since, in the case of the use of both bipolar and field-effect transistors as first and second transistors T6, T8, the driving is performed in relation to a mating contact, the transistors T6, T8 are arranged with the series resistor R5 such that the electrical potential of the mating contacts lies at a well-defined value. In the case of field-effect transistors, driving is performed with respect to the source, and in the case of bipolar transistors it is performed with respect to the emitter.

According to the sixth embodiment, the second transistor T8, the series resistor R5 and the first transistor T6 are arranged such that the source contact of the first transistor T6, which constitutes the abovementioned counter-electrode, is coincident with the gate potential of the controllable power semiconductor. Therefore, the required voltage at the gate terminal of the controllable power semiconductor 102, also referred to here as T5, versus source of the first transistor T6 is as follows: Vcc(GateDriver)≥Vin+Vcontrolmax≥Vgate(T5)+Vcontrolmax≥Vgate-source(T6)≥Vgate(T5)≥Vsource(T5). Therefore, the first transistor T6 is able to be controlled fully with the supply voltages of the gate driver, that is to say with the negative supply Vss(GateDriver) thereof and the positive supply Vcc(GateDriver) thereof. No voltage is required that goes beyond this potential level. For the continuous control of the first transistor T6, intermediate levels may accordingly be generated from said supply voltages. The embodiments apply accordingly for the second transistor T8.

Figure 13:
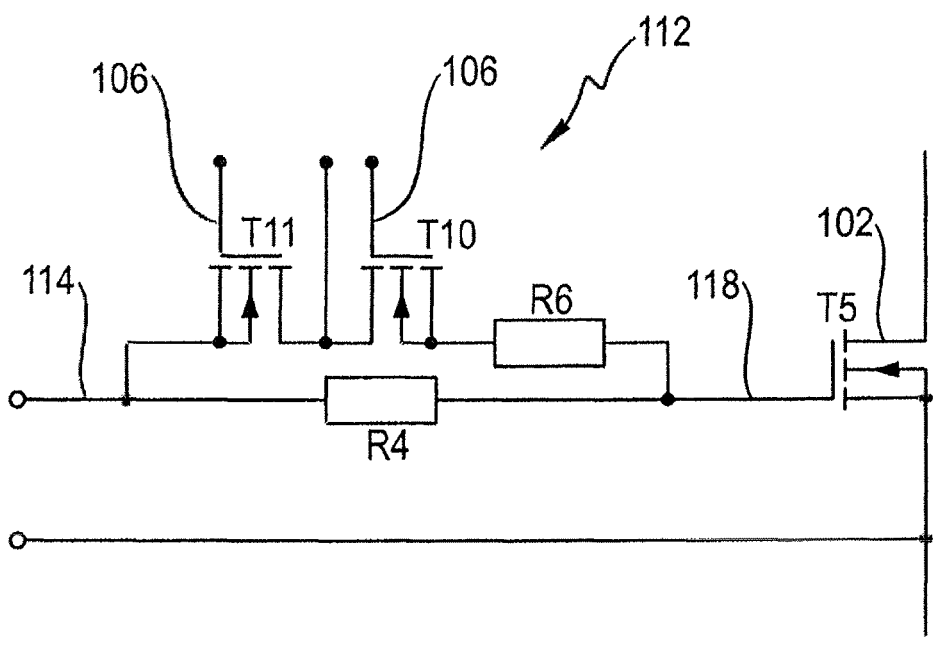
FIG. 13 shows a circuit diagram of a drive circuit having a driver circuit, a setting circuit and a control unit for driving a controllable power semiconductor according to a seventh embodiment, the setting circuit comprising a series circuit consisting of a series resistor, a first transistor and a second transistor, and a resistor connected in parallel therewith.

A drive circuit 100 according to a seventh embodiment is illustrated in FIG. 13. The drive circuit 100 comprises, as described previously with reference to the sixth embodiment, a driver circuit 110, a setting circuit 112 and a control unit 116 for driving a controllable power semiconductor 102, which is configured here as a field-effect transistor. According to the seventh embodiment, the setting circuit 112 comprises a series resistor R6, a first transistor T10 and a second transistor T11, which are connected in series in this order. A resistor R4 is connected in parallel with this series circuit. The first transistor T10 and the second transistor T11 are able to be driven independently by way of the setting parameter 106. The first and the second transistor T10, T11 are configured here as FETs, by way of example. The first and the second transistor T10, T11 are connected in opposing directions. One of the two transistors T10, T11 takes over the driving of the controllable power semiconductor 102 on the basis of the control signal 104 during switch-on, and the other one during switch-off.

The two transistors T10, T11 are arranged here with a common source terminal (in the case of an FET) or emitter terminal (in the case of bipolar transistors). The first and the second transistor T10, T11 are used as linear closed-loop controllers. As a result of this, the resistor of the transistors T10, T11 is operated with maximum conductivity or fully in the off state in a targeted manner in intermediate regions.

Figure 14:
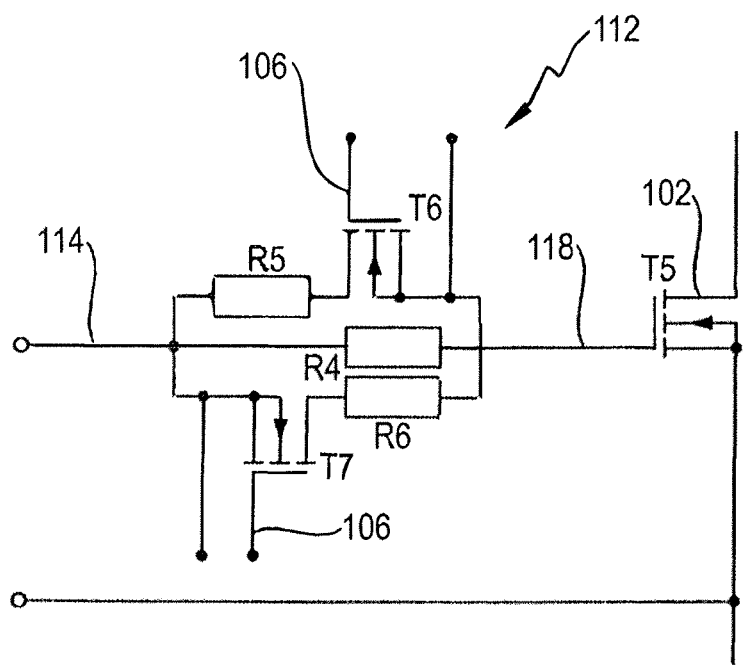
FIG. 14 shows a circuit diagram of a drive circuit having a driver circuit, a setting circuit and a control unit for driving a controllable power semiconductor according to an eighth embodiment, the setting circuit comprising a parallel circuit consisting of a first transistor, a second transistor and a resistor connected in parallel therewith, and an additional series resistor being connected in series with each transistor.

A drive circuit 100 according to an eighth embodiment is illustrated in FIG. 14. The drive circuit 100 comprises, as described previously with reference to the sixth embodiment, a driver circuit 110, a setting circuit 112 and a control unit 116 for driving a controllable power semiconductor 102, which is configured here as a field-effect transistor. According to the eighth embodiment, the setting circuit 112 comprises a first and a second transistor T6, T7, each connected in series with a series resistor R5, R6. The two series circuits are connected in parallel. A resistor R4 is additionally connected in parallel therewith.

The function of the two transistors T6, T7, is essentially as described above with reference to the corresponding first and second transistors. The first transistor T6 is arranged with its series resistor R5 such that the source contact of the first transistor T6, which constitutes a counter-electrode as explained above, is coincident with the gate potential of the controllable power semiconductor 102. Therefore, the required voltage at the gate terminal of the first transistor T6 is greater than the gate voltage at the controllable power semiconductor 102. Therefore, the first transistor T6 is able to be controlled fully with the supply voltages of the driver circuit, that is to say the negative supply Vss(GateDriver) thereof and the positive supply Vcc(GateDriver) thereof. Voltages that go beyond this are not necessary. For the continuous control of the first transistor T6, intermediate levels may accordingly be generated from said supply voltages. The same applies for the second transistor T7 and the series resistor R6 connected in series therewith.

The drive circuit 100 of exemplary embodiments 1 to 8 is configured to set the setting circuit 112 between two switching procedures of the one controllable power semiconductor 102. The setting circuit 112 is thus constant during the switching, that is to say during switch-on or during switch-off. Changes to the setting circuit 112 are made from switching procedure to switching procedure. Therefore, during switching of the controllable power semiconductor, an associated temporarily constant resistance of the setting circuit 112 may be assumed. This temporarily constant resistance is identical for the switch-on and the switch-off procedure in said exemplary embodiments 1 to 8. In alternative embodiments, the temporarily constant resistance is in each case different for the switch-on and the switch-off procedure. A change of the setting circuit 112 by way of the setting parameter is made only between switching procedures. As a result of this, the emission spectrum of the power semiconductor 102 is controlled on average over time.

In alternative exemplary embodiments, the drive circuit 100 is configured to set the setting circuit 112 during a switching procedure of the controllable power semiconductor. In contrast to the setting of the setting circuit 112 between two switching procedures, in which the overall spectrum is formed only from the average of the individual spectra, in this case the spectrum may be set exactly, as the switching procedure is able to be controlled at any time in terms of its speed. In these alternative exemplary embodiments, the setting circuit 112 is synchronized with the switching procedure by way of the control signal.

Figure 15:
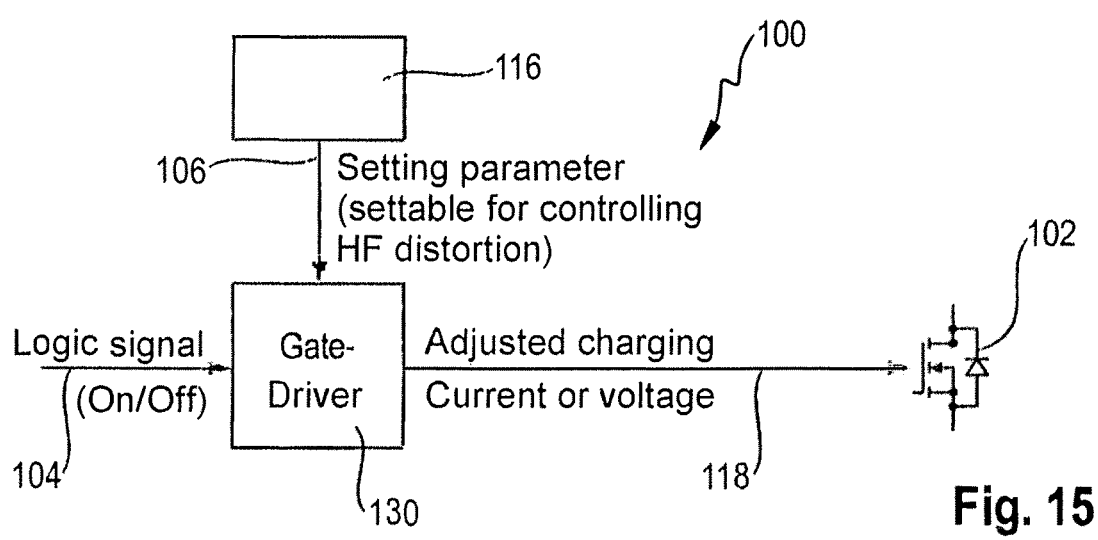
FIG. 15 shows a circuit diagram of a drive circuit having an integral driver circuit according to a ninth embodiment.
Figure 16:
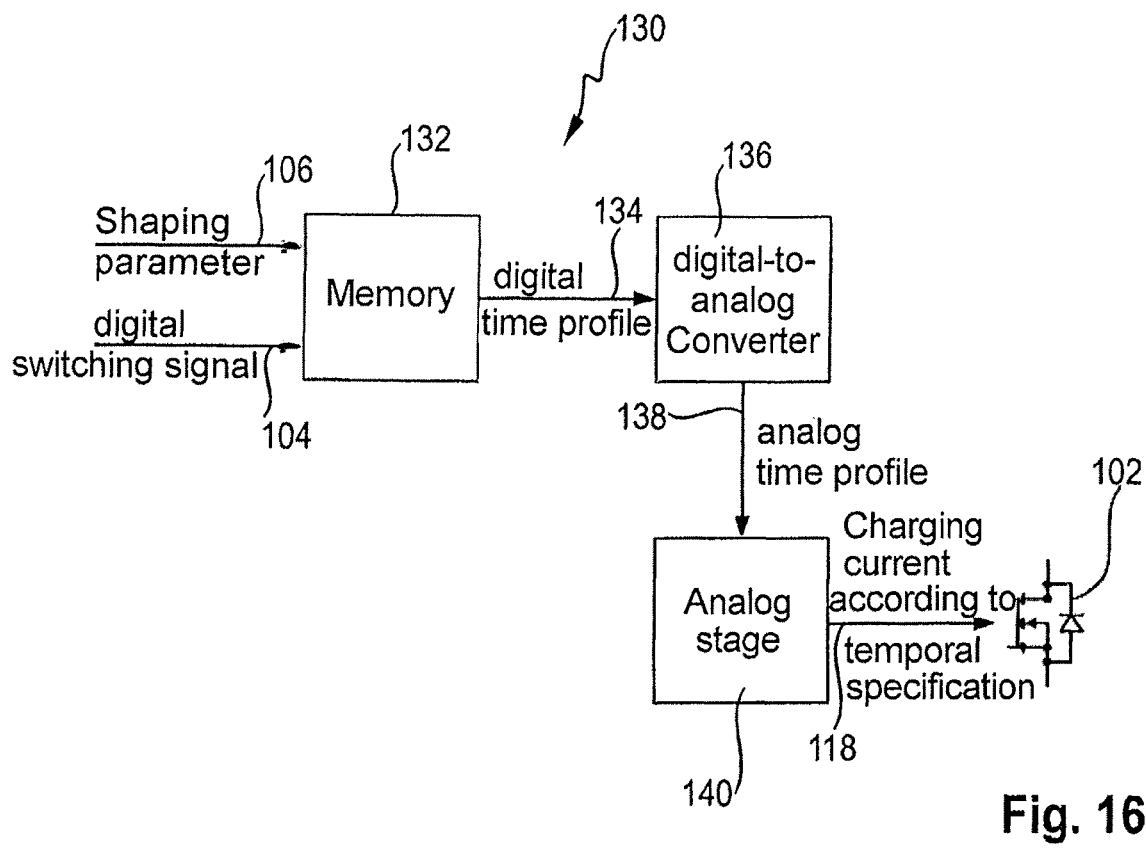
FIG. 16 shows a detailed circuit diagram of the integral driver circuit of the ninth embodiment from FIG. 15.
Figure 17:
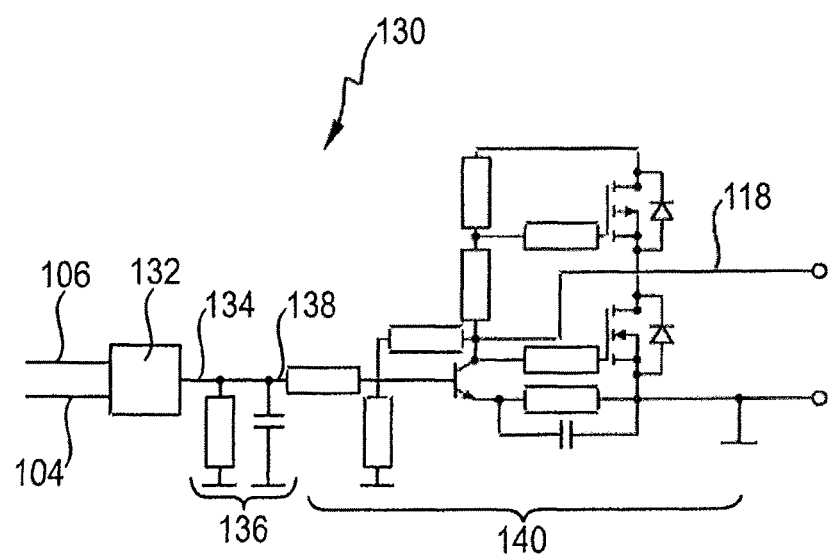
FIG. 17 shows a more detailed circuit diagram of the integral driver circuit of the ninth embodiment from FIG. 16.

A drive circuit 100 according to a ninth embodiment is illustrated in FIGS. 15 to 17. The drive circuit 100 has a driver circuit 130 for the controllable power semiconductor 102 and is configured to receive a logic signal as control signal 104. On the basis of the control signal 104, a drive signal 118 is generated for the controllable power semiconductor 102. The driver circuit 130 is furthermore configured to receive a setting parameter 106 as described above from a control unit 116 and to perform the temporal setting of the behavior of the controllable power semiconductor 102 during switching, taking into account the setting parameter 106. The driver circuit 130 is thus an integral driver circuit 130 that directly provides the adjusted drive signal 118 on the basis of the control signal 104 and the setting parameter 106, the adjusted drive signal 118 performing driving of the controllable power semiconductor 102 on the basis of the control signal 104 with temporal setting of the behavior of the controllable power semiconductor 102 during switching, taking into account the setting parameter 106. The integral driver circuit 130 is activated by way of a simple logic signal in this exemplary embodiment. The setting parameter 106 is fed to the integral driver circuit 130 via a separate input. The setting parameter 106 in this case does not have to be provided at the same time as the control signal 104. The driver circuit 130, in the case of a rising or falling edge, may accordingly use the respectively associated last setting parameter 106. This is implemented for example using a register, a sample and hold module or another memory.

As illustrated in detail in FIGS. 16 and 17, the integral driver circuit 130 of the ninth embodiment is configured as an analog driver circuit. The integral driver circuit 130 has a control unit 116 with a memory 132, only the memory 132 of which is illustrated in FIG. 16. The control unit 116 is configured to receive the control signal 104 and the setting parameter 106 and to provide a digital profile, selected by the setting parameter 106, of the control signal 104 from the memory 132. Accordingly, a digital signal 134 is provided from the memory 132, taking into account the setting parameter 106. During switching of the control signal 104 from low to high, or vice versa, a profile predefined for the respective case is output serially from the memory 132 as a binary data flow of 0 and 1.

Furthermore, the integral driver circuit 130 comprises a digital-to-analog converter 136. The digital-to-analog converter 136 is configured to convert the profile of the digital signal 134 into an analog driver signal 138. The digital-to-analog converter 136 is formed in this exemplary embodiment by a low-pass filter, which smooths the 0/1 flow.

In addition, the integral driver circuit 130 comprises an analog amplifier stage 140 that is configured to amplify the analog driver signal 138 and provide it as an adjusted drive signal 118 for the controllable power semiconductor 102. To this end, the analog amplifier stage 140 comprises a simple transistor push-pull stage, also called AB end stage.

Figure 18:
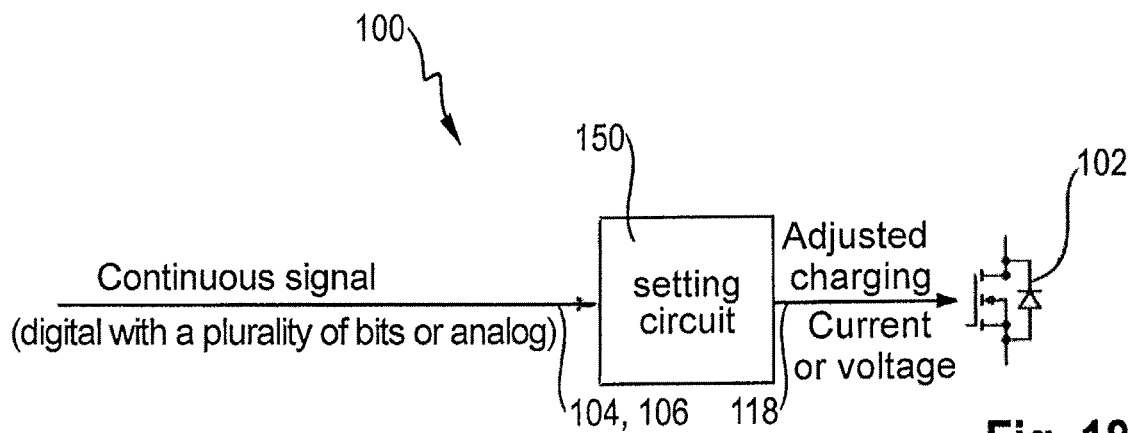
FIG. 18 shows a circuit diagram of a drive circuit according to a tenth embodiment.

A drive circuit 100 according to a tenth embodiment is illustrated in FIG. 18. The drive circuit 100 of the tenth embodiment has an input for a continuous signal and is configured to receive a combined signal with the control signal 104 and the setting parameter 106. The drive circuit 100 furthermore comprises an integral setting circuit 150 for generating an adjusted drive signal 118 for the controllable power semiconductor 102 on the basis of the control signal 104. To this end, the adjusted drive signal 118 for the controllable power semiconductor 102 is set on the basis of the setting parameter 106 in order to perform the temporal setting of the behavior of the controllable power semiconductor 102 during switching, taking into account the setting parameter 106.

The continuous signal is a coded analog signal or a serial or parallel digital signal. In one embodiment, an analog signal at the input directly codes the current profile or voltage profile of the output. In one alternative embodiment, a digital input is used that codes the profile of the output either in series or in parallel.

The driving of the setting parameter 106 by the control unit 116 is performed on the basis of the principles described below for all said exemplary embodiments.

According to aspects of the invention, the temporal switching behavior of the controllable power semiconductor 102 is controlled in a targeted manner by way of the setting parameter 106 in order thereby to gain control over the spectrum of the distortions of the output values caused by the switching.

In principle, it is also possible to control the temporal switching behavior on the basis of measured or estimated emissions in the immediate past, higher frequency ranges being able to be covered by taking into account the switching behavior of the power semiconductor 102.

In this case, either just the inverted profile of the switch-on procedure or in each case a specific dedicated profile may be used for the switch-off procedure.

In this case, the drive circuit 100 determines the setting parameter 106 itself in order to influence the electromagnetic emissions of the power semiconductor 102. To this end, the control device 116 performs a targeted change of the temporal setting of the behavior of the power semiconductor 102 during switching by way of a targeted change of the setting parameter 106 between switching procedures. The setting parameter 106 itself is thus not fixedly predefined, but rather able to be set. The change may be adaptive, so as to be able to perform an adjustment during operation. There is thus not just a temporally controllable recharging procedure of the control input of the power semiconductor, for example of the gate.

Open-loop control or closed-loop control of the change of the setting parameter 106 may be performed either on the basis of measurements or of estimations of the electromagnetic distortion or emission. By way of the open-loop control or closed-loop control, the temporal switching profile of the power semiconductor 102 is continuously influenced by controlling the temporal recharging profile of the control input. Measurement values may in this case be the temporal blocking voltage across the power semiconductor 102, the temporal load current, the magnetic field, for example located in the vicinity of the power semiconductor 102 or of the power circuit via a detection coil, possibly in a lower or rear-side position of a circuit board, or the electric field, for example via a detection dipole in the vicinity of the power semiconductor or of the power circuit, possibly in a lower or rear-side position of a circuit board, or the like.

As the entire system consisting of gate driver and the at least one power semiconductor is also easily able to be modeled, however, instead of a measurement, which is usually expensive, an estimation is generally also possible that therefore calculates a changed temporal profile of the recharging procedure on the basis of the estimation and adjusts the setting parameter 106 accordingly.

Figure 19:
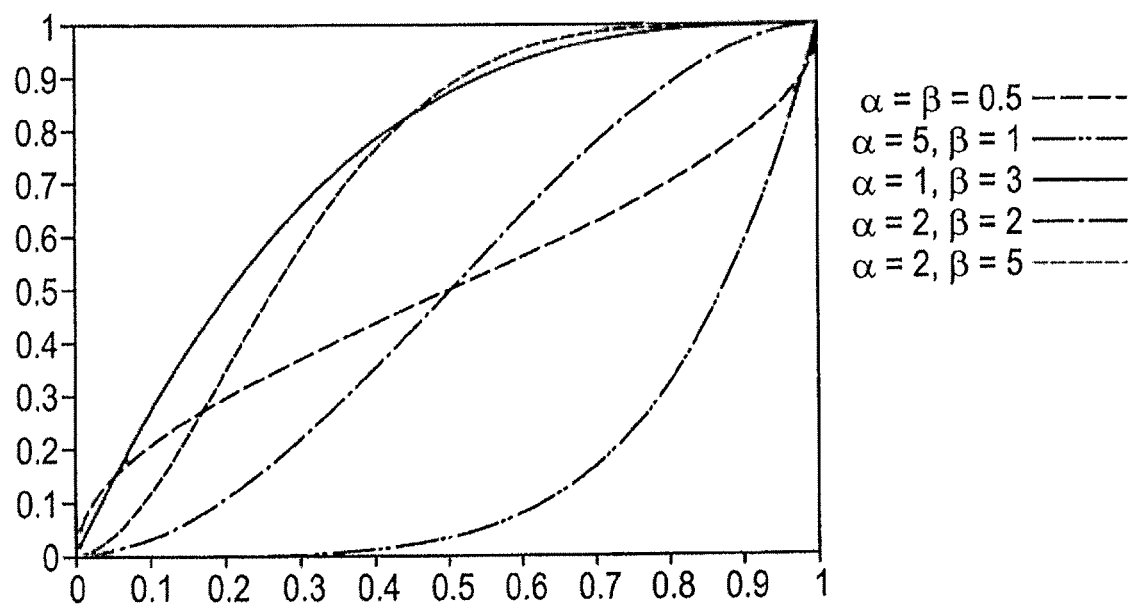
FIG. 19 shows a basic circuit diagram for performing closed-loop control according to the principle of a terminated series.

Furthermore, the control unit 116 is configured to perform the driving of the controllable power semiconductor 102 with the setting parameter 106 using closed-loop control in the manner of a terminated series, as is illustrated for example in FIG. 19. To this end, the emission spectrum of the power semiconductor 102 is primarily controlled via only a low number of degrees of freedom. In this exemplary embodiment, this is just one degree of freedom, namely the duration of the switching. The duration is given by the effective resistance of the setting circuit 112, 150 or by an amplification of the charge current constantly over the entire switch-on or switch-off duration of the power semiconductor 102. In an alternative embodiment with two degrees of freedom, the first derivative of the duration of the switching is additionally taken into account. The first derivative of the duration of the switching is given by a number defining the current in the middle of the switching procedure in comparison with the start and end of the switching procedure.

The charging voltage of the gate of the power semiconductor 102 resembles a cumulative distribution function (CFD) and is therefore able to be described in this form with the same parameters. In this exemplary embodiment, these are the width (standard deviation in the case of CFD), first-order symmetry (skew in the case of CFD), curvature (kurtosis in the case of CFD), etc. In an alternative refinement, use is made of typical parametric functions, known from statistics, to constitute CFDs, for example the gamma function. This type of description breaks the form of the switching down into a few characteristic values in the manner of a series and allows the use of conventional control methods, such as for example PID control.

In one alternative embodiment, the control unit 116 is configured to perform the driving of the controllable power semiconductor 102 with the setting parameter 106 on the basis of a determination of a connection between the temporal behavior of the controllable power semiconductor 102 during switching and a target spectrum for electromagnetic emissions using machine learning. A desired emission target spectrum is produced by determining the connection between gate driving and target spectrum by way of machine learning. Depending on the power semiconductor 102 that is used, the connection between the recharging dynamics at its control input (for example of the gate in the case of FETs and IGBTs) and the emission spectrum is not obvious and is influenced by nonlinearities. Machine learning methods have been developed in order to emulate and detect such complicated relationships. On this basis, it is likewise possible to create a closed-loop control system that allows closed-loop control of the emission spectrum within the meaning of the invention.

In order to avoid closed-loop control, in another alternative exemplary embodiment, an open-loop controller used. The open-loop control is performed by a statistical assignment of the parameters of the switching procedure. The switching dynamics may be described as a sigmoid function with a certain number of parameters depending on the desired flexibility, for example the moments that are also used in statistics for CFDs, or as parameters of conventional functions, for example of the gamma distribution. In a simple case, each parameter is assigned a value range and/or a statistical distribution. The control procedure consists in generating new sets of parameters more or less randomly according to these specifications following one or more switching procedures of the driver circuit 110, 130. For a uniform spectrum, for example, each parameter may be varied uniformly in one range. In one preferred refinement, not only is each parameter assigned a value range and/or a statistical distribution, but a common multidimensional distribution function is predefined, which thus also defines probabilities of the occurrence of each combination of parameter values.

The invention claimed is:

1. A drive circuit for a converter for use in a vehicle having an electric drive,
    wherein the drive circuit is configured to drive a switching procedure of at least one controllable power semiconductor of the converter on the basis of a control signal with temporal setting of a behavior of the at least one controllable power semiconductor during switching,
    wherein the drive circuit is configured to drive the switching procedure while taking into account a setting parameter for electromagnetic emissions of the at least one controllable power semiconductor,
    wherein the drive circuit comprises a digital driver circuit for the at least one controllable power semiconductor and a setting circuit that is arranged between the digital driver circuit and the at least one controllable power semiconductor,
    wherein the digital driver circuit is configured to (i) receive a logic signal as the control signal, and (ii) generate a drive signal for at least one controllable power semiconductor on the basis of the control signal,
    wherein the setting circuit is configured to receive the setting parameter, and the setting circuit is furthermore configured to adjust the drive signal of the digital drive circuit in order to perform the temporal setting of the behavior of the at least one controllable power semiconductor during switching while taking into account the setting parameter.

2. The drive circuit as claimed in claim 1, wherein the drive circuit is configured to perform a targeted change of the temporal setting of the behavior of the at least one controllable power semiconductor during switching through targeted changing of the setting parameter during operation.

3. The drive circuit as claimed in claim 1, wherein the setting circuit comprises a settable resistor (P1) that is configured to be set by way of the setting parameter.

4. The drive circuit as claimed in claim 1, wherein the setting circuit comprises a resistor (R1, R2, R4) and a first transistor (T2, T4, T6, T10) that are connected in a parallel circuit, wherein the first transistor (T2, T4, T6, T10) is configured to be driven by way of the setting parameter.

5. The drive circuit as claimed in claim 4, wherein the setting circuit comprises a second transistor (T7, T8, T11) that is connected in parallel with or in series with the first transistor (T2, T4, T6, T10), wherein the first and the second transistor (T7, T8, T11) are able to be driven independently by way of the setting parameter.

6. The drive circuit as claimed in claim 1, wherein the drive circuit is configured to set the setting circuit between two switching procedures of the at least one controllable power semiconductor.

7. The drive circuit as claimed in claim 1, wherein the drive circuit is configured to set the setting circuit during the switching procedure of the at least one controllable power semiconductor.

8. The drive circuit as claimed in claim 1, wherein the drive circuit has a control unit that is configured to perform the driving of the at least one controllable power semiconductor with the setting parameter with closed-loop control in a manner of a terminated series.

9. The drive circuit as claimed in claim 1, wherein the drive circuit has a control unit that is configured to perform the driving of the at least one controllable power semiconductor with the setting parameter on the basis of a determination of a connection between the temporal behavior of the at least one controllable power semiconductor during switching and a target spectrum for electromagnetic emissions using machine learning.

10. A converter for use in a vehicle having an electric drive, having at least one of the drive circuits as claimed in claim 1.

11. A vehicle having the electric drive and the at least one converter as claimed in claim 10.

* * * * *